(12) United States Patent
Funayoshi

(10) Patent No.: US 12,713,880 B2
(45) Date of Patent: Aug. 18, 2026

(54) BONDING APPARATUS, BONDING METHOD, ESTIMATION METHOD, AND ARTICLE MANUFACTURING METHOD

(71) Applicant: CANON KABUSHIKI KAISHA, Tokyo (JP)

(72) Inventor: Issei Funayoshi, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 516 days.

(21) Appl. No.: 18/352,494

(22) Filed: Jul. 14, 2023

(65) Prior Publication Data

US 2024/0038598 A1 Feb. 1, 2024

(30) Foreign Application Priority Data

Jul. 28, 2022 (JP) ................................ 2022-120714

(51) Int. Cl.
*H01L 21/66* (2006.01)
*H01L 21/67* (2006.01)
(Continued)

(52) U.S. Cl.
CPC ........ *H10P 74/203* (2026.01); *H10P 72/0606* (2026.01); *H10B 80/00* (2023.02); *H10W 90/00* (2026.01)

(58) Field of Classification Search
CPC ... H10P 74/203; H10P 72/0606; H10B 80/00; H10W 90/00
See application file for complete search history.

(56) References Cited

U.S. PATENT DOCUMENTS 5,019,946 A * 5/1991 Eichelberger ....... H01L 23/5389 361/795
2015/0087083 A1* 3/2015 Tani ...................... H01L 23/544 438/5
2017/0154864 A1 6/2017 Hayata et al.

FOREIGN PATENT DOCUMENTS

CN 106057704 A 10/2016
JP 2005116765 A 4/2005
(Continued)

OTHER PUBLICATIONS

Office Action issued in Taiwanese Appln. No. 112126505 dated Apr. 22, 2025.
(Continued)

*Primary Examiner* — David F Dunphy
(74) *Attorney, Agent, or Firm* — ROSSI, KIMMS & McDOWELL LLP

(57) ABSTRACT

The present invention provides a bonding apparatus for bonding, to a first member including a first bonding surface on which a first pattern is provided, a second member including a second bonding surface on which a second pattern is provided, comprising: a first image capturing device configured to capture an image of the first bonding surface; a second image capturing device configured to capture an image of the second bonding surface; and a controller configured to control a bonding process of aligning the first member and the second member based on a position of the first pattern obtained from the captured image by the first image capturing device and a position of the second pattern obtained from the captured image by the second image capturing device, and bonding the second member to the first member.

16 Claims, 9 Drawing Sheets

(51) Int. Cl.

| | |
|---|---|
| ***H10P 72/00*** | (2026.01) |
| ***H10P 74/20*** | (2026.01) |
| *H10B 80/00* | (2023.01) |
| *H10W 90/00* | (2026.01) |

(56) References Cited

FOREIGN PATENT DOCUMENTS

| | | | |
|---|---|---|---|
| JP | 2011169816 | A | 9/2011 |
| JP | 2014017471 | A | 1/2014 |
| JP | 2021190527 | A | 12/2021 |
| KR | 1020100063000 | A | 6/2010 |
| KR | 1020140117543 | A | 10/2014 |
| KR | 1020180126487 | A | 11/2018 |
| KR | 1020200110802 | A | 9/2020 |
| TW | 201735227 | A | 10/2017 |
| TW | 201909327 | A | 3/2019 |
| WO | 2006118018 | A1 | 11/2006 |

OTHER PUBLICATIONS

Notice of Allowance issued in Korean Appln. No. 10-2023-0090185 dated Jan. 21, 2026.

Office Action issued in Taiwanese Appln. No. 112126505, dated Dec. 29, 2025.

* cited by examiner

CNT
100
1
2
3
4
5
6
31
32
33
41
42
43
44
45
46
47
51
431
432
433
X
Y
Z 503
51b
51a
51
501
502

(Case1)
(Case2)
(Case3)
(Case4)
5A
6a
601
5B
51
501
5C
6a,51
51
6a
5D
6a,51
51
6a 4
42
47
6
433
432
431
43
46
45
44
1
41
2
2
31
51
61
100'
Z
Y
X

BONDING APPARATUS, BONDING METHOD, ESTIMATION METHOD, AND ARTICLE MANUFACTURING METHOD

BACKGROUND OF THE INVENTION

Field of the Invention

The present invention relates to a bonding apparatus, a bonding method, an estimation method, and an article manufacturing method.

Description of the Related Art

Japanese Patent Laid-Open No. 2021-190527 describes a method of determining the quality of the bonding state of a chip and substrate by measuring the distortion amounts of the chip and substrate when the chip is ultrasonically bonded to the substrate. Japanese Patent Laid-Open No. 2011-169816 describes a method of inspecting the quality of the bonding portion of a substrate and semiconductor chip by measuring the tilt of the semiconductor chip with respect to the substrate based on an image obtained by capturing the bonding portion of the substrate and semiconductor chip from the side.

In a bonding apparatus for bonding first and second members, it is important to reduce a deviation of the relative position between a pattern provided on the bonding surface of the first member and a pattern provided on the bonding surface of the second member after bonding the first and second members. However, after bonding the first and second members, the bonding surfaces of the first and second members cannot be checked from the outer appearance. It is therefore difficult to easily and accurately obtain the relative position between the pattern of the first member and that of the second member after bonding. In the methods described in Japanese Patent Laid-Open Nos. 2021-190527 and 2011-169816, only the quality of bonding between the first member (substrate) and the second member (chip) is determined based on the outer appearance, and the relative position between the pattern of the first member and that of the second member after bonding cannot be obtained.

SUMMARY OF THE INVENTION

The present invention provides a technique advantageous for obtaining, for example, a relative position between the pattern of a first member and that of a second member after bonding the first and second members.

According to one aspect of the present invention, there is provided a bonding apparatus for bonding, to a first member including a first bonding surface on which a first pattern is provided, a second member including a second bonding surface on which a second pattern is provided, comprising: a first image capturing device configured to capture an image of the first bonding surface of the first member; a second image capturing device configured to capture an image of the second bonding surface of the second member; and a controller configured to control a bonding process of aligning the first member and the second member based on a position of the first pattern obtained from the captured image by the first image capturing device and a position of the second pattern obtained from the captured image by the second image capturing device, and bonding the second member to the first member, wherein after the bonding process, the controller is configured to: obtains, based on the image obtained by capturing the second member bonded to the first member by the first image capturing device, feature position information representing a position of a feature portion of the second member with respect to the first member, and estimates a relative position between the first pattern and the second pattern after the bonding process based on positional relationship information obtained in advance and the feature position information, the positional relationship information representing a positional relationship between the feature portion and the second pattern in the second member.

Further features of the present invention will become apparent from the following description of exemplary embodiments (with reference to the attached drawings).

BRIEF DESCRIPTION OF THE DRAWINGS

FIG. 3A is a schematic view showing a state in which an image of a die is captured;

DESCRIPTION OF THE EMBODIMENTS

Figure 1:
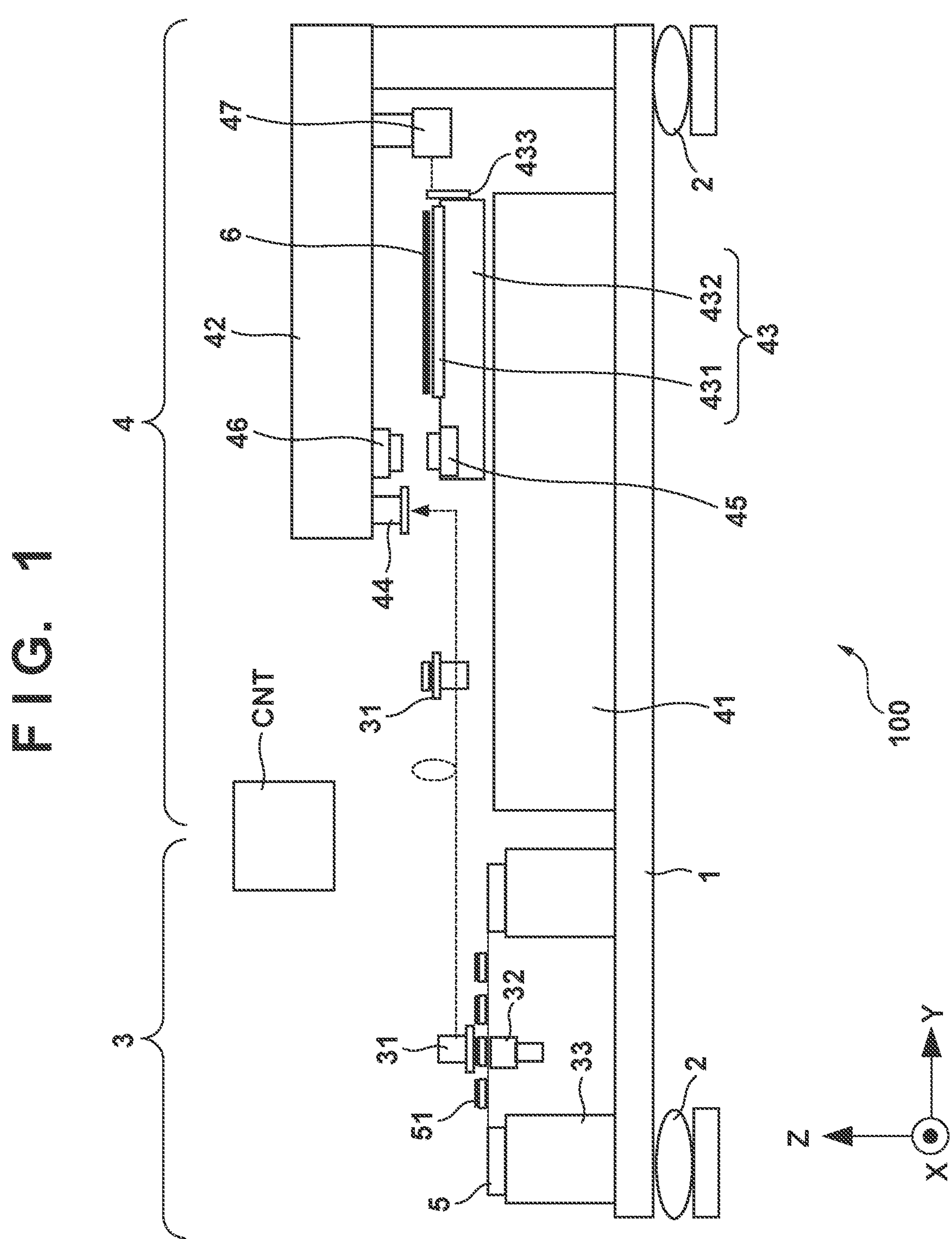
FIG. 1 is a schematic view showing a bonding apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be typically indicated on an XYZ coordinate system in which a surface parallel to a horizontal surface is defined as the X-Y plane. Directions parallel to the X-axis, the Y-axis, and the Z-axis of the XYZ coordinate system are defined as the X direction, the Y direction, and the Z direction, respectively. A rotation about the X-axis, a rotation about the Y-axis, and a rotation about the Z-axis are defined as θX, θY, and θZ, respectively. Control and driving (movement) concerning the X-axis, the Y-axis, and the Z-axis mean control or driving (movement) concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

In embodiments to be described later, an example in which a wafer (substrate) on which semiconductor devices are formed is used as the first member (first bonded object) and a die (chip) obtained by dividing into pieces a wafer on which semiconductor devices are formed is used as the second member (second bonded object) will be explained. However, the first member and the second member are not limited to these bonded objects, and various changes and modifications can be made within the scope of the present invention.

As the first member, a substrate having a bonding surface (first bonding surface) on which a pattern (first pattern) is provided can be used. Examples of the substrate are a silicon wafer, a silicon wafer on which wirings are formed, a glass wafer, a glass panel on which wirings are formed, an organic panel (PCB) on which wirings are formed, and a metal panel, in addition to a wafer on which semiconductor devices are formed. The substrate may be a wafer to which one or more dies are already bonded.

As the second member, a chip having a bonding surface (second bonding surface) on which a pattern (second pattern) is provided can be used. Examples of the chip are a stack of dies, a small piece of a material, an optical element, a MEMS, and a structure, in addition to a die obtained by dividing into pieces a wafer on which semiconductor devices are formed.

In the embodiments to be described later, various temporary or permanent bonding methods can be applied as a bonding method for the first and second members. Examples of the bonding method are bonding using an adhesive, temporary bonding using a temporal adhesive, bonding by hybrid bonding, atomic diffusion bonding, vacuum bonding, and bump bonding.

Industrial application examples of the embodiments to be described later will be explained.

The first application example is manufacturing of a stacked memory. In a case where a bonding apparatus according to the embodiments to be described later is applied to manufacturing of a stacked memory, a wafer (substrate) on which a memory serving as a semiconductor device is formed is used as the first member, and a die (chip) on which a memory is formed is used as the second member. For example, in manufacturing of a stacked memory having eight memory layers, the second member (die) formed as the eighth memory layer is bonded on the first member (substrate) already having seven memory layers. Note that the final layer of the stacked memory may be not a memory layer but a layer on which a driver for driving the memory is formed.

The second application example is heterogeneous integration of a processor. The mainstream of conventional processors is a System On Chip (SoC) in which a logic circuit, a Static Random Access Memory (SRAM), and the like are formed in one semiconductor element. To the contrary, in heterogeneous integration, a plurality of types of elements are formed from separate wafers by applying a process optimal for each element, and bonded to manufacture a processor. This can implement cost reduction and yield improvement of processors. In a case where the bonding apparatus according to the embodiment to be described later is applied to heterogeneous integration, a wafer (substrate) on which a logic device serving as a semiconductor device is formed is used as the first member. A die (chip) separated after probing, such as an SRAM, an antenna, or a driver, is used as the second member. In heterogeneous integration, for example, dies of different types are sequentially bonded, so bonded objects to the first member sequentially increase. More specifically, when a die having an SRAM is bonded onto a logic wafer, the logic wafer is the first member and the die having the SRAM is the second member. When a die having an element to be formed on the SRAM is bonded onto the die having the SRAM, a bonded object of the logic wafer and the die having the SRAM is the first member, and the die having the element is the second member. Note that when bonding a plurality of dies to overlap each other, as for the order of bonding, bonding is preferably started from a thin die such that a bonding head does not interfere with a bonded die.

The third application example is 2.5D bonding using a silicon interposer. The silicon interposer is a silicon wafer on which wirings are formed. The 2.5D bonding is a method of bonding a plurality of types of dies onto the silicon interposer, and electrically connecting the plurality of types of dies by the wirings on the interposer. In a case where the bonding apparatus according to the embodiment to be described later is applied to the 2.5D bonding, a silicon wafer on which wirings are formed is used as the first member, and a separated die is used as the second object. In the 2.5D bonding, for example, a plurality of types of dies are bonded to the silicon interposer, so the structure of a silicon interposer to which one or more dies are already bonded is sometimes handled as the first member. Note that when bonding a plurality of dies to the silicon interposer, as for the order of bonding, bonding is preferably started from a thin die such that a bonding head does not interfere with a bonded die.

The fourth application example is 2.1D bonding using an organic interposer or a glass interposer. The organic interposer is an organic panel (a PCB substrate or a CCL substrate) used as a package substrate, on which wirings are formed. The glass interposer is a glass panel on which wirings are formed. The 2.1D bonding is a method of bonding a plurality of types of dies to the organic interposer or the glass interposer, and electrically bonding the plurality of types of dies by the wirings on the interposer. In a case where the bonding apparatus according to the embodiment to be described later is applied to the 2.1D bonding, in 2.1D bonding using the organic interposer, an organic panel on which wirings are formed is used as the first member, and a separated die is used as the second member. To the contrary, in 2.1D bonding using the glass interposer, a glass panel on which wirings are formed is used as the first member, and a separated die is used as the second member. In the 2.1D bonding, for example, a plurality of types of dies are bonded to the organic interposer or the glass interposer, so the structure of an organic interposer or a glass interposer to which one or more dies are already bonded is sometimes handled as the first member. Note that when bonding a plurality of dies to the interposer, as for the order of bonding, bonding is preferably started from a thin die such that a bonding head does not interfere with a bonded die.

The fifth application example is temporary bonding in a fan-out package manufacturing process. For example, fan-out packaging as advanced packaging applied to a semiconductor manufacturing process includes fan-out wafer-level packaging and fan-out panel-level packaging. The fan-out wafer-level packaging is a process of reconstructing separated dies into a wafer shape using a mold resin to do packaging. The fan-out panel-level packaging is a process of reconstructing separated dies into a panel shape using a mold resin to do packaging. In such fan-out packaging, rewirings from the dies to bumps are formed, or rewirings that bond different types of dies are formed on a molded reconstructed substrate. At this time, if the die array accuracy is low, when transferring the rewiring pattern using a step-and-repeat exposure apparatus, it may be difficult to accurately align the rewiring pattern to the dies. For this reason, the plurality of dies are required to be arrayed accurately in the fan-out packaging. In a case where the bonding apparatus according to the embodiment to be described later is applied to the fan-out package manufacturing process, a metal panel is used as the first member and a separated die is used as the second member. More specifically, the separated dies are temporarily bonded in series to the metal panel by a temporary adhesive using the bonding apparatus. After that, the plurality of dies temporarily bonded on the metal panel are molded into a wafer shape or a panel shape by a molding apparatus, and peeled from the metal panel after molding. Accordingly, a reconstructed wafer or a reconstructed panel on which the plurality of dies are arrayed is manufactured. Note that in the fan-out package manufacturing process, the array of the plurality of dies may change in the molding process. Thus, in temporarily bonding the plurality of dies onto the metal panel using the bonding apparatus, the bonding position of each die on the metal panel is preferably adjusted to correct the change of the array caused by the molding process.

The sixth application example is heterogeneous substrate bonding. For example, in an infrared image sensor, InGaAs known as a high-sensitivity material is used for a sensor unit configured to receive light, and silicon capable of implementing high-speed processing is used for a logic circuit configured to extract data. Accordingly, a high-sensitivity high-speed infrared image sensor can be manufactured. However, from InGaAs crystal, only wafers whose diameter is as small as 4 inches are mass-produced, which is smaller than a mainstream 300-mm silicon wafer. Hence, there has been proposed a method of bonding, to a 300-mm silicon wafer on which a logic circuit is formed, a die obtained by dividing an InGaAs substrate into pieces. The bonding apparatus according to the embodiment to be described later can also be applied to heterogeneous substrate bonding of bonding substrates made of different materials and having different sizes. In the application of the bonding apparatus to heterogeneous substrate bonding, a substrate with a large diameter such as a silicon wafer is used as the first member, and a die (small piece) of a material such as InGaAs is used as the second member. Note that the die (small piece) of the material such as InGaAs may be a slice of a crystal and is preferably cut into a rectangular shape.

First Embodiment

The first embodiment according to the present invention will be described. FIG. 1 is a schematic view showing a bonding apparatus 100 according to the first embodiment. In FIG. 1, a direction perpendicular to the holding surface of a stage 43 (to be described later) that holds a wafer 6 (substrate) is defined as the Z direction, and directions orthogonal to each other on a plane parallel to the holding surface of the stage 43 are defined as the X and Y directions. The bonding apparatus 100 sequentially bonds a plurality of dies 51 serving as second bonded objects to predetermined positions on the wafer 6 serving as a first member (first bonded object). The plurality of dies 51 are arranged on a dicing tape adhered to a dicing frame 5.

In this embodiment, as shown in FIG. 1, the bonding apparatus 100 includes a pickup unit 3, a bonding unit 4, and a controller CNT. The pickup unit 3 and the bonding unit 4 are mounted on a base 1 damped by mounts 2. The pickup unit 3 and the bonding unit 4 are mounted on the same base 1 in this embodiment, but may be individually mounted on separate bases.

The pickup unit 3 includes a pickup head 31, a release head 32, and a frame holder 33. The pickup unit 3 picks up the dies 51 one by one from the dicing tape adhered to the dicing frame 5. The frame holder 33 holds the dicing frame 5. The release head 32 pushes up the target die 51 from the back side of the dicing tape adhered to the dicing frame 5 such that the target die 51 to be picked up projects upward from the remaining dies. At this time, the target die 51 is partially peeled from the dicing tape. The pickup head 31 holds (chucks) by vacuum power or the like the target die 51 pushed up by the release head 32, and peels (separates) the target die 51 from the dicing tape. The pickup head 31 is configured to be movable from the pickup unit 3 to the bonding unit 4. While moving from the pickup unit 3 to the bonding unit 4, the pickup head 31 rotates (flip-chip) so as to turn over the die 51, and transfers the die 51 to a bonding head 44 to be described later. At this time, the pickup head 31 contacts the bonding surface (second bonding surface) of the die 51. To cope with a bonding method of performing bonding by activating the surface, such as hybrid bonding, highly stable surface processing such as diamond-like carbon (DLC) coating or fluorine coating is preferably performed on the bonding surface of the die 51.

The bonding unit 4 includes the stage 43, the bonding head 44, a die observation camera 45, a wafer observation camera 46, and an interferometer 47. The stage 43 is configured to be movable on a stage base 41, and the die observation camera 45 is mounted on the stage 43. The bonding head 44, the wafer observation camera 46, and the interferometer 47 are mounted on an upper base 42.

First, a configuration on the stage base 41 will be explained. The stage 43 and the die observation camera 45 are provided on the stage base 41.

The stage 43 (first holder) includes a chuck 431 that holds the wafer 6 (substrate) by vacuum power or the like on a holding surface parallel to the X and Y directions, and a driving mechanism 432 that drives the chuck 431 (wafer 6). The driving mechanism 432 includes an actuator such as a linear motor, and is configured to drive the wafer 6 in the X and Y directions and the θZ direction. The driving mechanism 432 may be configured to drive the wafer 6 in the Z direction. A relative rotational operation of the wafer 6 and the die 51 in the θZ direction may be performed by rotating the wafer 6 by the stage 43, or in addition to or instead of this, may be performed by rotating the die 51 by the bonding head 44 to be described later. The stage 43 also includes a mirror 433 for measuring the position of the stage 43 in the X and Y directions. The mirror 433 serves as the target of the interferometer 47 (to be described later) that measures the position of the stage 43 in the X and Y directions.

The die observation camera 45 (second image capturing device) is a camera for observing the bonding surface (second bonding surface) of the die 51. The die observation camera 45 can be arranged so that it can capture an image of the bonding surface of the die 51 in a state in which the die 51 is held by the bonding head 44 (second holder). In this embodiment, the die observation camera 45 is mounted on the stage 43 and can move in the X and Y directions along with movement of the stage 43. The die observation camera 45 is used to obtain (measure) information representing the position of a pattern (second pattern) provided on the bonding surface of the die 51, and information representing the positional relationship between the feature portion of the die 51 and the pattern provided on the bonding surface of the die 51.

The feature portion of the die 51 is an index that can be confirmed in, for example, both an image obtained by capturing the bonding surface of the die 51 and an image obtained by capturing the back surface (surface opposite to the bonding surface) of the die 51. That is, the feature portion of the die 51 is an index that can be used as the reference of a position of the die 51 on both the bonding surface and the back surface. Examples of the feature portion of the die 51 are the outer edge of the die 51 and/or a through via (through hole) extending from the bonding surface to back surface of the die 51.

The die observation camera 45 is also used to measure the distances of a plurality of points in the direction of height (Z direction) on the bonding surface of the die 51, that is, the height distribution of the bonding surface of the die 51. That is, the die observation camera 45 can be used to measure the position of the die 51 held by the bonding head 44 in the direction of height, the tilt of the die 51, and/or the flatness of the bonding surface. Note that in this embodiment, the pattern provided on the bonding surface of the die 51 can be defined to include a circuit pattern and in addition, a mark for measuring the position of the die 51.

Next, a mechanism mounted on the upper base 42 will be explained. The bonding head 44, the wafer observation camera 46, and the interferometer 47 are mounted on the upper base 42.

The bonding head 44 (second holder) holds by vacuum power or the like the die 51 transferred from the pickup head 31, and drives the die 51 in the −Z direction to bond the die 51 to the wafer 6. In this embodiment, the bonding of the die 51 to the wafer 6 is performed by driving the die 51 in the −Z direction by the bonding head 44, but is not limited to this. For example, the bonding of the die 51 to the wafer 6 may be performed by driving the wafer 6 in the +Z direction by the stage 43, or relatively driving the die 51 and the wafer 6 by the bonding head 44 and the stage 43.

The wafer observation camera 46 (first image capturing device) is a camera for observing the bonding surface (first bonding surface) of the wafer 6. The wafer observation camera 46 can be arranged so that it can capture an image of the wafer 6 in a state in which the wafer 6 is held by the stage 43 (first holder). The wafer observation camera 46 is used to obtain (measure) information representing the position of a pattern (first pattern) provided on the bonding surface of the wafer 6, and information representing the position of the feature portion of the die 51 with respect to the wafer 6 after bonding the wafer 6 and the die 51. The wafer observation camera 46 is also used to measure the distances of a plurality of points in the direction of height (Z direction) on the bonding surface of the wafer 6, that is, the height distribution of the bonding surface of the wafer 6. That is, the wafer observation camera 46 can be used to measure the position of the wafer 6 held by the stage 43 in the direction of height, the tilt of the wafer 6, and/or the flatness of the bonding surface. The interferometer 47 irradiates with light the mirror 433 provided on the stage 43, and measures the position of the stage 43 based on the light reflected by the mirror 433.

The bonding apparatus 100 according to this embodiment is configured to rotate (flip-chip) the pickup head 31 and transfer the die 51 to the bonding head 44, but is not limited to this. For example, it is also possible to provide two or more die holders between the pickup head 31 and the bonding head 44, perform flip-chip by transferring the die 51 to the two or more die holders, and then transfer the die 51 to the bonding head 44. It is also possible to provide a driving mechanism that drives the bonding head 44 between the pickup unit 3 and the bonding unit 4 such that that the bonding head 44 itself moves to the bonding unit 4 and receives the die 51. For higher productivity, the bonding apparatus 100 may include a plurality of pickup units 3, a plurality of pickup heads 31, a plurality of release heads 32, and a plurality of bonding heads 44.

The controller CNT is formed from, for example, a computer (information processing apparatus) including a processor such as a Central Processing Unit (CPU) and a storage such as a memory. The controller CNT controls the bonding process by controlling each unit of the bonding apparatus 100. The bonding process is a process of aligning the wafer 6 and the die 51 so that the pattern (first pattern) of the wafer 6 and the pattern (second pattern) of the die 51 overlap each other, and then bonding the die 51 to the wafer 6. More specifically, the controller CNT obtains the position of the pattern (first pattern) provided on the bonding surface of the wafer 6 based on an image of the bonding surface (first bonding surface) of the wafer 6 that is captured by the wafer observation camera 46. Also, the controller CNT obtains the position of the pattern (second pattern) provided on the bonding surface of the die 51 based on an image of the bonding surface (second bonding surface) of the die 51 that is captured by the die observation camera 45. The controller CNT can control the bonding process based on the position of the pattern of the wafer 6 and that of the pattern of the die 51.

Figure 2:
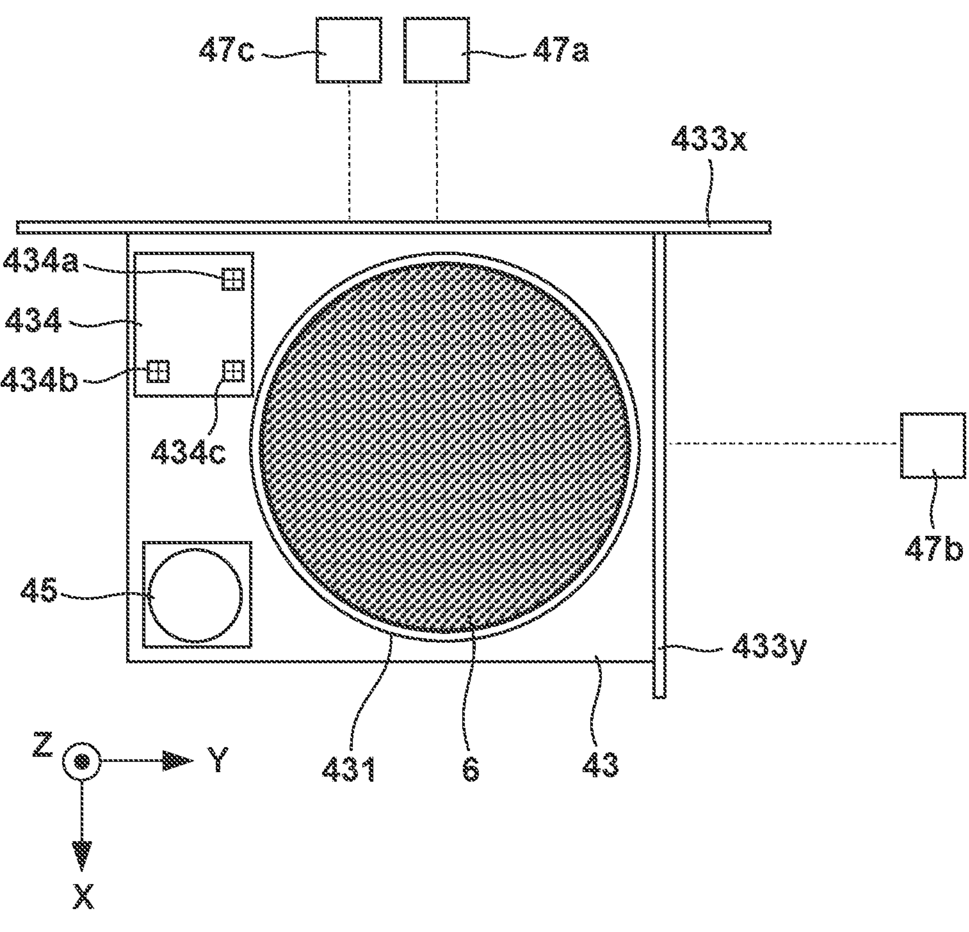
FIG. 2 is a view showing a stage viewed from the +Z direction.

FIG. 2 is a view showing the stage 43 viewed from the +Z direction. The wafer 6 is held by a the chuck 431. To perform two-dimensional positioning, the stage 43 includes a bar mirror 433*x* for performing position measurement in the X direction and the θZ direction (rotational direction), and a bar mirror 433*y* for performing position measurement in the Y direction. The bar mirror 433*x* is the target of interferometers 47*a* and 47*c* that perform position measurement in the X direction. The interferometers 47*a* and 47*c* are arranged at a distance from each other in the Y direction. The rotational amount (θZ direction) of the stage 43 can be obtained from the difference between the measurement result of the interferometer 47*a* and that of the interferometer 47*c*. The bar mirror 433*y* is the target of an interferometer 47*b* that performs position measurement in the Y direction. The interferometers 47*a* to 47*c* measure in real time the position of the stage 43 in the X direction, the position in the Y direction, and the rotational amount in the θZ direction. The controller CNT can perform feedback control of driving of the stage 43 in real time and two-dimensionally position the stage 43 accurately. In the bonding apparatus 100 according to this embodiment, accurate position measurement by the interferometers 47*a* to 47*c*, and feedback control of the driving mechanism of the stage 43 based on the result of the position measurement can function as the positioning mechanism of the stage 43.

A reference plate 434 including a plurality of marks 434*a* to 434*c* is mounted on the stage 43. The reference plate 434 is made of a material with a low thermal expansion coefficient, and includes the marks 434*a* to 434*c* formed (drawn) at a high position accuracy. For example, the reference plate 434 can be formed by drawing marks on a quartz substrate using the drawing method of a semiconductor lithography process. The reference plate 434 can be configured to have an upper surface almost flush with the upper surface of the wafer 6 held by the stage 43 (chuck 431). In this embodiment, the reference plate 434 can be observed by the wafer observation camera 46, but the present invention is not limited to this when a reference plate observation camera is separately provided. The stage 43 may be constituted by a coarse motion stage that can be driven within a large range, and a fine motion stage that can accurately be driven within a small range on the coarse motion stage. In this case, the die observation camera 45, the mirror 433, the chuck 431, and the reference plate 434 require accurate positioning and thus are preferably fixed to the fine motion stage.

A method of guaranteeing the origin position, magnification, and rotation in the θZ direction, and orthogonality of the stage 43 using the reference plate 434 will be described. While controlling the wafer observation camera 46 to capture (observe) an image of the mark 434*a*, the controller CNT obtains the measured values of the interferometers 47*a* to 47*c* when the mark 434*a* is arranged at the center of the image obtained by the wafer observation camera 46, and sets the measured values as the origin of the stage 43. Then, while controlling the wafer observation camera 46 to capture (observe) an image of the mark 434*b*, the controller CNT obtains the measured values of the interferometers 47*a* to 47*c* when the mark 434*b* is arranged at the center of the image obtained by the wafer observation camera 46. From the obtained measured values, the controller CNT decides the Y-axis direction and Y magnification of the stage 43. Next, while controlling the wafer observation camera 46 to capture (observe) an image of the mark 434*c*, the controller CNT obtains the measured values of the interferometers 47*a* to 47*c* when the mark 434*c* is arranged at the center of the image obtained by the wafer observation camera 46. From the obtained measured values, the controller CNT decides the X-axis direction and X magnification of the stage 43. That is, a direction from the mark 434*b* toward the mark 434*c* on the reference plate 434 is defined as the Y-axis of the bonding apparatus 100, a direction from the mark 434*a* toward the mark 434*c* is defined as the X-axis of the bonding apparatus 100, and the directions and orthogonality of the axes are calibrated. Also, the interval between the mark 434*b* and the mark 434*c* is defined as the scale reference of the bonding apparatus 100 in the Y direction, the interval between the mark 434*a* and the mark 434*c* is defined as the scale reference of the bonding apparatus 100 in the X direction, and calibration is performed. The refractive index of the optical path of the interferometer changes due to variations of the atmospheric pressure and temperature, this makes the measured value vary, and thus it is preferable for the interferometers 47*a* to 47*c* to perform calibration at an arbitrary timing and guarantee the origin position, magnification, rotation, and orthogonality of the stage 43. To reduce variations of the measured values of the interferometers 47*a* to 47*c*, the space in which the stage 43 moves may be covered with a temperature control chamber to control the temperature.

In this embodiment, an example in which the reference plate 434 is attached to the stage 43 and an image of the reference plate 434 is captured (observed) by the wafer observation camera 46 has been described, but the present invention is not limited to this. For example, the reference plate 434 may be attached to the upper base 42 to capture (observe) an image of the reference plate 434 by the die observation camera 45. Even in this configuration, the origin position, magnification, rotation, and orthogonality of the stage 43 can be guaranteed. In this embodiment, an example in which calibration is performed by capturing (observing) an image of the reference plate 434 has been described, but the present invention is not limited to this. For example, calibration may be performed by an abutting operation to a reference surface. Alternatively, accurate positioning of the stage 43 may be performed using a position measurement means such as a white interferometer for which an absolute value is guaranteed.

In the bonding apparatus 100 having the above-described configuration, it is important to reduce a deviation of the relative position between a pattern provided on the bonding surface of the wafer 6 (first member) and a pattern provided on the bonding surface of the die 51 after bonding the die 51 to the wafer 6. However, after bonding the die 51 to the wafer 6, the bonding surfaces of the wafer 6 and die 51 cannot be checked from the outer appearance. It is therefore difficult to easily and accurately obtain the relative position between the pattern of the wafer 6 and that of the die 51 after bonding. Here, the wafer observation camera 46 may be an infrared camera. According to this method, infrared light is used to pass through the die 51 and capture its image, thereby measuring the relative position between the pattern of the wafer 6 and that of the die 51 after bonding. However, such an infrared camera is expensive and may be disadvantageous to the cost of the bonding apparatus 100. Even if the infrared camera is used, the pattern of the wafer 6 and that of the die 51 after bonding cannot be captured clearly, and it is hard to accurately measure the relative position between the pattern of the wafer 6 and that of the die 51 after bonding.

In the bonding apparatus 100 according to this embodiment, the controller CNT controls the wafer observation camera 46 (first image capturing device) to capture an image of the outer appearance of the die 51 bonded to the wafer 6 after the bonding process of the wafer 6 (first member) and the die 51 (second member). Based on the image obtained by the wafer observation camera 46, the controller CNT obtains feature position information representing the position of the feature portion of the die 51 with respect to the wafer 6. Then, the controller CNT estimates the relative position between the pattern of the wafer 6 and that of the die 51 after the bonding process based on the feature position information and positional relationship information representing the positional relationship between the pre-obtained feature portion of the die 51 and the pattern of the die 51. Accordingly, the pattern of the wafer 6 and that of the die 51 after the bonding process can be easily and accurately obtained. Examples of this embodiment will be described below.

Example 1

Figure 3B:
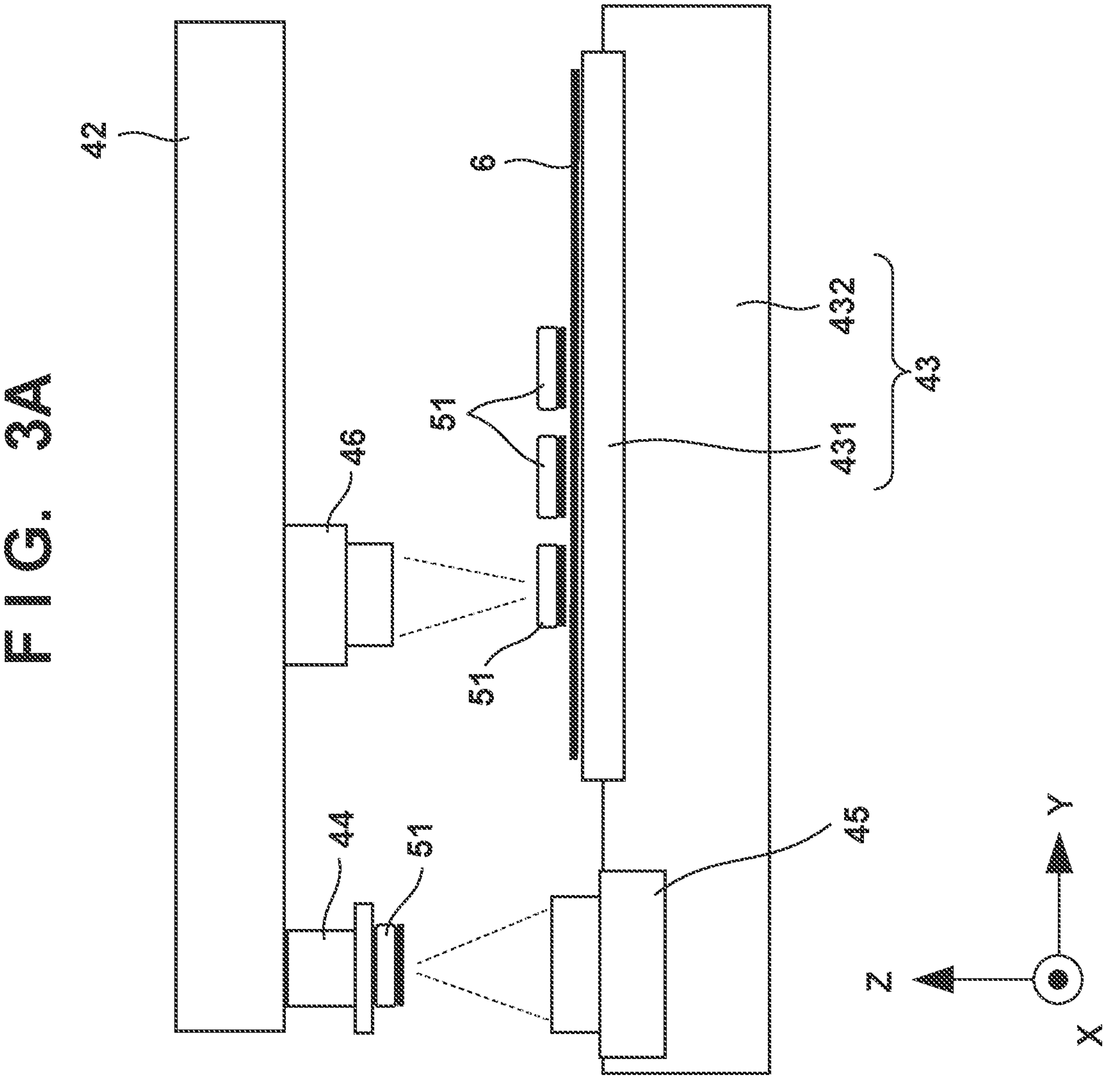
FIG. 3B is a schematic view showing an example of the configuration of the die.
Figure 4:
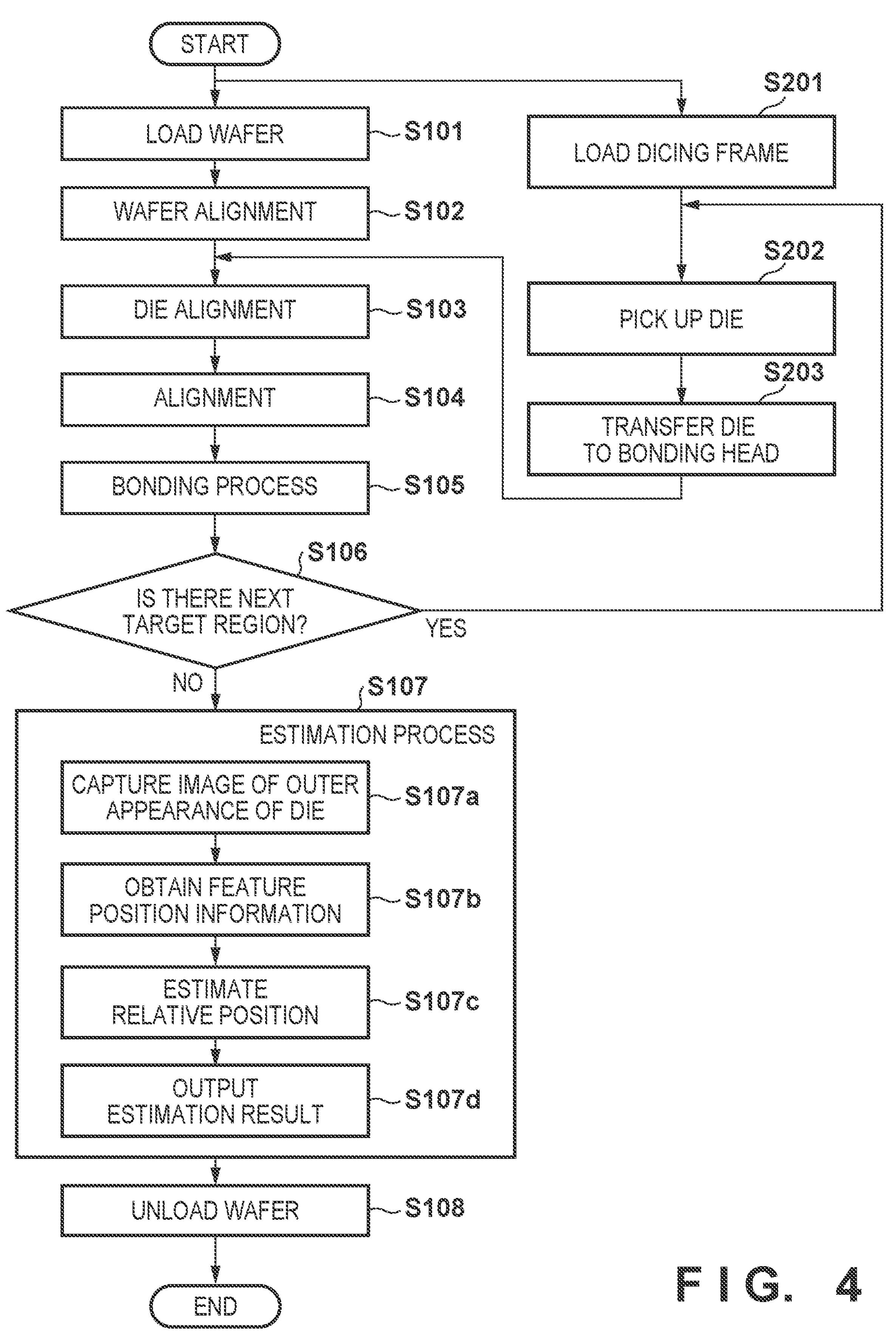
FIG. 4 is a flowchart showing the operation sequence of the bonding apparatus in Example 1.

The operation of a bonding apparatus 100 in Example 1 will be described with reference to FIGS. 3A, 3B, and 4. FIG. 3A is a schematic view showing a state in which an image of a die 51 is captured. FIG. 3B is a schematic view showing an example of the configuration of the die 51 used in Example 1. As shown in FIG. 3B, the die 51 used in Example 1 has a bonding surface 51*a* and a back surface 51*b* that is a surface opposite to the bonding surface. The bonding surface 51*a* has an element pattern 501 (second pattern) and an alignment mark 502. The die 51 has through vias 503 extending from the bonding surface 51*a* to the back surface 51*b*. Although the through vias 503 are illustrated only on the back surface 51*b* in FIG. 3B, it may be understood that at least some of the through vias 503 are exposed even on the bonding surface 51*a*. In this case, the through vias 503 can be used as the above-mentioned feature portion. FIG. 4 is a flowchart showing the operation sequence of the bonding apparatus 100 in Example 1. A controller CNT can execute processes in the flowchart of FIG. 4.

In step S101, the controller CNT loads a wafer 6 serving as a first member (first bonded object) onto a stage 43 (chuck 431) of the bonding apparatus 100 using a wafer conveyance mechanism (not shown). At this time, the space in the bonding apparatus 100 is desirably kept at a high cleanliness of about class 1 because adhesion of a foreign substance to the bonding surface of the wafer 6 causes a bonding failure. To keep a high cleanliness even for the wafer 6, the wafer 6 is desirably stored in a container that has a high airtightness and maintains a high cleanliness, and loaded from the container onto the stage 43 of the bonding apparatus 100. The container is, for example, a Front Opening Unify Pod (FOUP).

To increase the cleanliness of the wafer 6, a washing mechanism that washes the wafer 6 may be provided in the bonding apparatus 100. A mechanism that performs preprocessing for the bonding process on the wafer 6 may also be provided in the bonding apparatus 100. For example, the preprocessing is processing of applying an adhesive to the bonding surface of the wafer 6 in bonding using an adhesive, or processing of activating the bonding surface of the wafer 6 in hybrid bonding. After positions of the wafer 6 in the θZ direction and the X and Y directions are measured by a prealignment unit (not shown), the wafer 6 is coarsely positioned based on the measurement result and conveyed onto the chuck 431 of the stage 43. The position of the wafer 6 in the OZ direction can be measured by detecting a notch or orientation flat of the wafer 6, and the position of the wafer 6 in the X and Y directions can be measured by detecting the outer shape of the wafer 6.

In step S102, the controller CNT performs wafer alignment using a wafer observation camera 46. In the wafer alignment, the wafer observation camera 46 captures an image of the bonding surface of a target region (bonding goal) of the wafer 6 to which the die 51 is to be bonded. Based on the obtained image, the position of a pattern (first pattern) provided on the wafer 6 (target region) is obtained. Note that the wafer 6 has a plurality of target regions.

Focus adjustment when capturing an image of the bonding surface of the wafer 6 may be performed by a focus adjustment mechanism provided in the wafer observation camera 46, or by driving the wafer 6 in the Z direction by the Z driving mechanism of the stage 43. When an alignment mark is provided on the bonding surface of the wafer 6, the position of the pattern of the wafer 6 can be obtained using the alignment mark. To the contrary, when no alignment mark is provided on the bonding surface of the wafer 6, the position of the pattern of the wafer 6 may be obtained using a portion (to be sometimes referred to as a specifiable portion hereinafter) of the bonding surface that allows specifying the position of the pattern. As the specifiable portion, for example, part of the pattern of the wafer 6 can be used.

For example, the controller CNT can measure the position of the pattern of the wafer 6 by measuring the image position of an alignment mark or specifiable portion with respect to the center of the image obtained by the wafer observation camera 46. The alignment mark or specifiable portion will be sometimes referred to as an alignment mark or the like. For example, there is a method of accurately measuring the position of the alignment mark or the like with respect to the reference point of the bonding apparatus 100. According to this method, the stage 43 is driven to make a mark formed on a reference plate 434 fall within the visual field of image capturing of the wafer observation camera 46, and the wafer observation camera 46 captures an image of the mark on the reference plate 434. Based on the position of the stage 43 at that time and the mark position within the image obtained by the wafer observation camera 46, the reference point of the bonding apparatus 100 is decided. Based on the image obtained by capturing the alignment mark or the like by the wafer observation camera 46, the offset amount of the position of the alignment mark or the like with respect to the reference point is obtained. Hence, the position of the alignment mark can be measured accurately from the position of the reference point and the offset amount. As the position of the reference point of the bonding apparatus 100, the position of the mark on the reference plate 434 is used in Example 1. However, the position of another place may be used if it is a position serving as a reference.

Since an interferometer 47 has a narrow measurement range in the θZ direction, a rotation amount in the θZ direction that can be corrected by the stage 43 is relatively small. If the rotation amount of the wafer 6 in the θZ direction is large, the wafer 6 is preferably rearranged on the stage 43 so as to correct the rotation amount of the wafer 6 in the θZ direction. When the wafer 6 is rearranged on the stage 43, the position of the wafer 6 needs to be measured again. During execution of step S102, the surface position of the wafer 6 is preferably measured using a first height measurement means (not shown) that measures the surface position of the bonding surface of the wafer 6. This is because the thickness of the wafer 6 varies, and the surface position of the wafer 6 is important to accurately manage (control) the gap between the wafer 6 and the die 51 in the bonding process.

Since the origin position, the magnification, the position in the X and Y directions, rotation in the θZ direction, and the orthogonality are guaranteed for the stage 43 using the reference plate, the position of the wafer 6 mounted on the stage 43 with respect to the origin position of the stage 43 and the like can be measured. On the wafer 6, target regions (bonding goals or goal regions) where semiconductor devices are formed are repetitively arranged at a predetermined period. That is, the wafer 6 includes a plurality of target regions to which the dies 51 are bonded, respectively. A semiconductor device in each target region is accurately positioned and manufactured using a semiconductor manufacturing apparatus. A plurality of target regions on the wafer 6 are arrayed generally at a repetitive period with a nano-level accuracy. For this reason, in the wafer alignment of step S102, it is not necessary to measure the positions of all target regions on the wafer 6, and it is only necessary to measure the positions of the bonding goals of some of the target regions on the wafer 6. More specifically, the positions of semiconductor devices (patterns or marks) in three or more target regions out of a plurality of target regions on the wafer 6 are measured, and statistical processing is performed. Accordingly, the array of target regions, the origin position of the array, the position in the X and Y directions, the rotation amount in the θZ direction, the orthogonality, and the magnification error of the repetitive period can be calculated.

The chuck 431 may include a mechanism that controls the temperature of the wafer 6. This is because in a case where the thermal expansion coefficient of a silicon wafer is 3 ppm/° C., and the diameter of the wafer is 300 mm, if the temperature increases by 1° C., the position of the outermost periphery moves by 150 mm×0.000003=0.00045 mm=450 nm. If a bonding position (for example, the position of the target region) moves after wafer alignment, it may be difficult to accurately bond the wafer 6 and the die 51. Thus, the temperature of the wafer 6 is preferably controlled to keep the temperature change of the wafer 6 to be 0.1° C. or less.

Note that in Example 1, the wafer 6 is used as the first member (first bonded object). If an interposer on which wirings are formed is used as the first member, not the array of semiconductor devices but the array of the repetitively formed wirings is measured. If a wafer or panel without a pattern is used as the first member, wafer alignment in step S102 need not be executed.

Steps S101 and S102 described above are processes regarding the wafer 6 serving as the first member (first bonded object). In parallel to steps S101 and S102, processes (steps S201 to S203) regarding the die 51 serving as the second member (second bonded object) are executed.

In step S201, the controller CNT loads a dicing frame 5 to a pickup unit 3 (onto a frame holder 33) using a conveyance mechanism (not shown). The dicing frame 5 is a frame having an opening at the center, and a dicing tape is adhered to the dicing frame 5 so as to cover the opening. A plurality of dies 51 divided by a cutter such as a dicer are arrayed on the dicing tape. Conventionally, the dicing frame 5 is conveyed by an unsealed magazine. However, adhesion of a foreign substance to the bonding surface 51*a* of the die 51 causes a bonding failure, so the dicing frame 5 needs to be conveyed in a container that has a high airtightness and maintains a high cleanliness. To increase the cleanliness of the die 51, a washing mechanism that washes the die 51 on the dicing frame 5 (dicing tape) may be provided inside the bonding apparatus 100. After the rotation of the dicing frame 5 in the θZ direction and the shift position (position in the X and Y directions) of the dicing frame 5 are coarsely determined by a prealignment unit (not shown) based on the outer shape of the dicing frame 5, the dicing frame 5 can be conveyed onto the frame holder 33.

In step S202, the controller CNT controls a pickup head 31 and a release head 32 to pick up one die 51 from the dicing frame 5 (dicing tape). More specifically, the controller CNT moves the pickup head 31 and the release head 32 to the position of the die 51 to be picked up (to be also referred to as the target die 51 hereinafter). The controller CNT drives the release head 32 in the +Z direction to push up the target die 51 from the back side of the dicing tape. In this state, the controller CNT drives the pickup head 31 in the −Z direction so that the pickup head 31 and the target die 51 come into contact with each other. The target die 51 is then held (chucked) by the pickup head 31 by vacuum power or the like, and can be peeled from the dicing tape by driving the pickup head 31 in the +Z direction. The target die 51 to be picked up can be decided based on non-defective die (Known Good Die: KGD) information transmitted to the bonding apparatus 100 online. Normally, only non-defective dies are picked up as the target dies 51. However, as for a target region having a defective device on the wafer 6, a defective die (Known Bad Die: KBD) may be picked up as the target die 51.

In step S203, the controller CNT delivers (transfers) the target die 51 picked up by the pickup head 31 to the bonding head 44 of the bonding unit 4. More specifically, as shown in FIG. 1, the controller CNT arranges the pickup head 31 below the bonding head 44 by driving in the X direction the pickup head 31 picking up the target die 51. The controller CNT then delivers the target die 51 from the pickup head 31 to the bonding head 44 by driving the pickup head 31 in the +Z direction. When picking up the target die 51 by the pickup head 31, the bonding surface 51*a* of the target die 51 is oriented in the +Z direction and comes into contact with the pickup head 31. In contrast, when delivering the target die 51 from the pickup head 31 to the bonding head 44, the bonding surface 51*a* of the target die 51 needs to be oriented in the −Z direction. To do this, the pickup head 31 can be driven to rotate such that the target die 51 is turned over (flip-chip) while being conveyed to the bonding head 44.

In Example 1, an example in which the pickup head 31 directly conveys the target die 51 to the bonding head 44 has been described, but the present invention is not limited to this. For example, when one or more conveyance mechanisms are provided on the conveyance path of the target die 51 to the bonding head 44, the target die 51 may be conveyed to the bonding head 44 through a process of delivering the target die 51 to the one or more conveyance mechanisms. A mechanism that performs preprocessing for the bonding process on the target die 51 may be provided inside the bonding apparatus 100. The preprocessing is, for example, processing of applying an adhesive to the bonding surface 51*a* of the target die 51 in bonding using an adhesive, or processing of activating the bonding surface 51*a* of the target die 51 in hybrid bonding. As the preprocessing, washing processing of the target die 51 may be executed. The preprocessing may be performed while conveying the target die 51 to the bonding head 44.

By the above processes, the wafer 6 is held by the stage 43, and the target die 51 is held by the bonding head 44.

Subsequently, in step S103, the controller CNT performs die alignment using the die observation camera 45. In the die alignment, as shown in FIG. 3A, the die observation camera 45 is arranged below the target die 51 held by the bonding head 44 by driving the stage 43 on which the die observation camera 45 is mounted. The die observation camera 45 captures an image of the bonding surface 51*a* of the target die 51, and the position of the pattern 501 (second pattern) provided on the bonding surface 51*a* of the die 51 is obtained based on the captured image.

Focus adjustment when capturing an image of the bonding surface 51*a* of the target die 51 may be performed by the focus adjustment mechanism provided in the die observation camera 45, or by driving the die observation camera 45 in the Z direction by the Z driving mechanism of the stage 43. When the Z driving mechanism is provided on the bonding head 44, focus adjustment may be performed by driving the target die 51 in the Z direction by the Z driving mechanism of the bonding head 44. In Example 1, the alignment mark 502 is provided on the bonding surface 51*a* of the target die 51, so the position of the pattern 501 of the target die 51 can be obtained using the alignment mark 502. For a general die, an alignment mark is often arranged on a scribe line and removed together with the scribe line. In this case, the position of the pattern of the die may be obtained using a portion (to be sometimes referred to as a specifiable portion hereinafter) of the bonding surface that allows specifying the position of the pattern. As the specifiable portion, for example, the end of the array of pads or bumps arranged on the bonding surface, a region having an aperiodic array, or the outer edge (outer shape) of the die can be used.

For example, the controller CNT can measure the position of the pattern 501 of the target die 51 by measuring the image position of the projected alignment mark 502 or specifiable portion with respect to the center of the image obtained by the die observation camera 45. The measurement of the position of the target die 51 can include measurement of the rotation amount (rotation in the θZ direction) of the target die 51. The rotation amount of the target die 51 can be measured by, for example, obtaining the positions of respective specifiable portions on the bonding surface 51*a* of the target die 51 based on the image obtained by the die observation camera 45. The positions of the respective specifiable portions can be obtained based on a plurality of images obtained by individually capturing the specifiable portions while driving the die observation camera 45 by the stage 43. Alternatively, when the entire target die 51 falls within the visual field of image capturing of the die observation camera 45, the positions of the respective specifiable portions can be obtained from an image obtained by capturing the entire bonding surface 51*a* of the target die 51 by the die observation camera 45. The rotation amount of the target die 51 can be corrected by rotating the wafer 6 by the stage 43 in the bonding process. However, the measurement range of the interferometer 47 in the θZ direction is narrow. Thus, if the rotation amount of the target die 51 is large, the target die 51 is desirably rearranged on the bonding head 44 so as to correct the rotation amount of the target die 51. When the target die 51 is rearranged on the bonding head 44, the position of the target die 51 needs to be measured again.

During execution of step S103, the surface position of the bonding surface 51*a* of the target die 51 is preferably measured using a second height measurement means (not shown) that measures the surface position of the bonding surface 51*a* of the target die 51. Since the thickness of the target die 51 varies, the surface position of the target die 51 is important to accurately manage (control) the gap between the wafer 6 and the target die 51 in the bonding process. Further, the heights of a plurality of positions on the bonding surface 51*a* of the target die 51 (that is, the height distribution of the bonding surface 51*a*) may be measured to adjust the relative postures of the wafer 6 and target die 51 based on the measurement result in the bonding process. The relative postures can be adjusted by a tilt mechanism mounted on the stage 43 and/or the bonding head 44.

In step S103, the controller CNT obtains positional relationship information using the die observation camera 45. As described above, the positional relationship information is information representing the positional relationship between the feature portion of the target die 51 and the pattern 501 of the target die 51. As described above, the feature portion of the target die 51 is an index that can be confirmed in both an image obtained by capturing the bonding surface 51*a* of the target die 51 and an image obtained by capturing the back surface 51*b* of the target die 51. The feature portion of the target die 51 is the outer edge (outer shape) of the target die 51 and/or the through via 503. For example, the controller CNT can control the die observation camera 45 to capture an image of the bonding surface 51*a* of the target die 51, and obtain as the positional relationship information the positional relationship between the feature portion of the target die 51 and the pattern 501 of the target die 51 in the obtained image. When the outer edge of the target die 51 is used as the feature portion, the die observation camera 45 is preferably so configured that the entire target die 51 falls within the visual field of image capturing. In Example 1, an example in which positional relationship information is obtained using the die observation camera 45 in step S103 has been described. However, it is only necessary to obtain the positional relationship information before the bonding process (step S105) to be described later, and the positional relationship information may be obtained in advance using, for example, an external apparatus.

In step S104, the controller CNT drives the stage 43 to align the wafer 6 and the target die 51 so that the pattern of the wafer 6 and the pattern 501 of the target die 51 overlap each other. More specifically, the controller CNT drives the stage 43 so that a target region of the wafer 6 to which the target die 51 is to be bonded is arranged below the target die 51 held by the bonding head 44. The controller CNT then aligns the wafer 6 and the target die 51 based on the position of the pattern of the wafer 6 obtained in step S102 and the position of the pattern 501 of the target die 51 obtained in step S103. At this time, it is preferable to align the wafer 6 and the target die 51 so as to reduce a relative rotation deviation and/or a posture deviation between the wafer 6 and the target die. If the relative position between the wafer 6 and the target die 51 in the X and Y directions changes (shifts) in the bonding process to be described later, the wafer 6 and the target die 51 may be aligned using the change of the relative position as an offset amount. The offset amount can be obtained in advance by experiment, simulation, or the like.

In step S105, the controller CNT bonds the target die 51 to the wafer 6 by narrowing the interval between the wafer 6 and the target die 51 (bonding process). The bonding process may be performed by driving the target die 51 in the Z direction by the bonding head 44, or driving the wafer 6 in the Z direction by the stage 43. Alternatively, the bonding process may be performed by driving the target die 51 and the wafer 6 relatively in the Z direction by the bonding head 44 and the stage 43. To accurately control the interval (gap) between the wafer 6 and the target die 51, a detector (for example, an encoder) may be provided to detect the position of the bonding head 44 and/or stage 43 in the Z direction. In the bonding process, ultrasonic waves may be applied to the bonding head 44 and/or the stage 43 in a state in which the wafer 6 and the target die 51 are in contact with each other (that is, ultrasonic bonding may be applied). After bonding the wafer 6 and the target die 51, the controller CNT cancels the holding of the target die 51 by the bonding head 44 and widens the interval between the wafer 6 and the target die 51. Note that the bonding process may be understood to include the above-described alignment in step S104.

To improve the alignment accuracy between the wafer 6 and target die 51 even during execution of the bonding process, the relative position between the wafer 6 and the target die 51 in the X and Y directions can be controlled. For example, when the relative position between the wafer 6 and the target die 51 in the X and Y directions is controlled by driving the stage 43, the width of a mirror 433 in the Z direction is preferably so set as to irradiate the mirror 433 with light from the interferometer 47 even if the stage 43 is driven in the Z direction. Also, a detector (for example, an encoder or a gap sensor) that detects the relative position between the bonding head 44 and the stage 43 in the X and Y directions may be provided. In this case, feedback control of the relative position can be performed while the detector detects (monitors) the relative position between the bonding head 44 and the stage 43 in the X and Y directions during execution of the bonding process. If the wafer 6 and the target die 51 come into contact with each other, the position of the stage 43 feedback-controlled based on the measurement result of the interferometer 47 is restrained. Hence, the control method of the relative position between the wafer 6 and the target die 51 in the X and Y directions is preferably switched before and after contact by, for example, stopping the feedback processing at the start of contact between the wafer 6 and the target die 51. In bump bonding, processing necessary for the bump bonding can be executed in step S105 by, for example, pressing the target die 51 against the wafer 6 at a predetermined pressure (pressing pressure).

In step S106, the controller CNT determines whether the dies 51 have been bonded to all target regions on the wafer 6. Normally, several ten to several hundred semiconductor devices are formed as a plurality of target regions on one wafer 6, and the dies 51 can be bonded to the respective target regions. If a target region (next target region) to which the die 51 is to be bonded next exists on the wafer 6, the process returns to step S202. If no next target region exists on the wafer 6, that is, the dies 51 have been bonded to all the target regions on the wafer 6, the process advances to step S107.

In Example 1, an example in which whether the next target region exists is determined after the bonding process and the process returns to step S202 has been explained. However, the determination of whether the next target region exists may be performed before the end of the bonding process. In this case, step S202 can be performed in parallel to execution of the bonding process. That is, in parallel to execution of the bonding process, the die 51 to be bonded to the next target region is picked up from the dicing frame 5 (dicing tape). In a case where a plurality of types of dies 51 are bonded to each target region (semiconductor device) on the wafer 6, dies of one type are bonded to all the target regions of the wafer 6 and then bonding of dies of the next type starts. At the start of bonding dies of the next type, the loading operation (step S201) of the dicing frame 5 on which dies of the next type are arranged is executed and then the die pickup in step S202 can be executed.

In step S107, the controller CNT performs the estimation process for estimating the relative position between the pattern of the wafer 6 and the pattern 501 of the target die 51 after the bonding process. The estimation process can include steps S107*a* to S107*c*. In Example 1, the estimation process can be performed on respective target regions on the wafer 6, that is, the respective dies 51 bonded to the wafer 6.

In step S107*a*, as shown in FIG. 3A, the controller CNT controls the wafer observation camera 46 to capture an image of the outer appearance of the die 51 bonded to the wafer 6. The obtained image includes the back surface 51*b* of the die 51 bonded to the wafer 6 and part of the wafer 6 around the die 51. In step S107*b*, the controller CNT obtains feature position information based on the image obtained in step S107*a*. As described above, the feature position information is information representing the position of the feature portion of the die 51 with respect to the wafer 6. The feature portion of the die 51 is the outer edge (outer shape) of the die 51 and/or the through via 503. In step S107*b*, the position of the feature portion on the back surface 51*b* of the die 51 is obtained.

In step S107*c*, the controller CNT estimates (calculates) the relative position between the pattern of the wafer 6 and the pattern 501 of the die 51 after the bonding process based on the feature position information obtained in step S107*b* and the positional relationship information obtained in step S103. More specifically, the controller CNT can estimate the relative position by converting the position of the feature portion of the die 51 in the feature position information into the position of the pattern 501 of the die 51 based on the positional relationship information.

In step S107*d*, the controller CNT outputs the estimation result in step S107*c*. The estimation result may be output by displaying information of the estimation result on the user interface (for example, a display) of the bonding apparatus 100 or transmitting information of the estimation result to an external computer. The controller CNT may output, as the estimation result, information (for example, numerical information representing a deviation of the relative position) representing the relative position between the pattern of the wafer 6 and the pattern 501 of the die 51 after the bonding process, or output information representing the evaluation result of the relative position. The evaluation result can be, for example, a result of evaluating whether the estimated deviation of the relative position falls within an allowable range.

Figure 5:
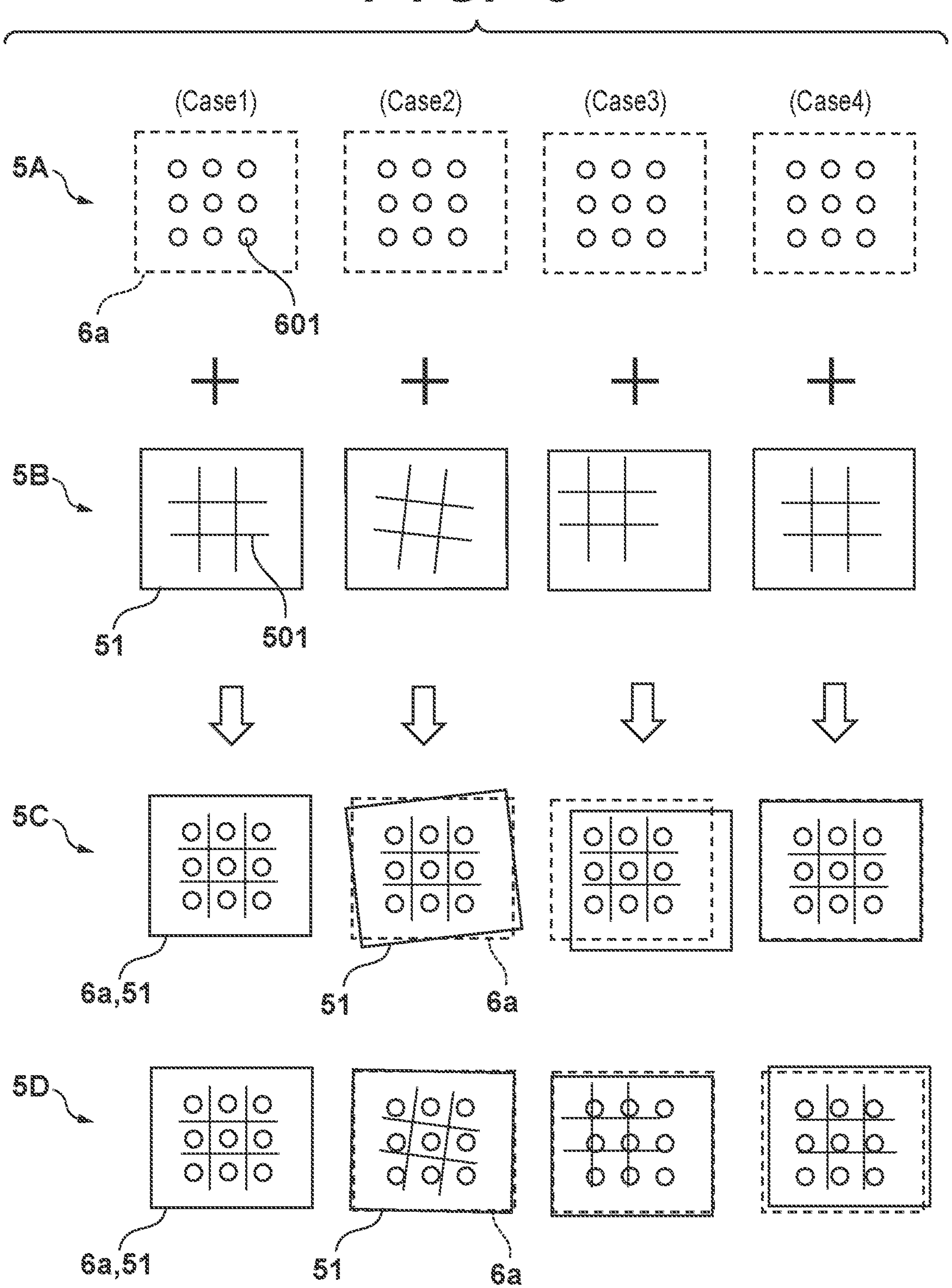
FIG. 5 is a view schematically showing bonding between a wafer and the die.

FIG. 5 is a view schematically showing bonding between the wafer 6 and the die 51. The reference number 5A in FIG. 5 shows the bonding surface of a target region 6*a* on the wafer 6, and a pattern 601 is represented by nine circles. The reference number 5B in FIG. 5 shows the bonding surface of the die 51, and the pattern 501 is represented by lines. The reference number 5C in of FIG. 5 shows the relative position between the pattern 601 of the wafer 6 and the pattern 501 of the die 51 that is recognized by the controller CNT in the alignment of step S104. In the alignment of step S104, the controller CNT recognizes the relative position based on the position of the pattern 601 of the wafer 6 obtained in advance in step S102 and the position of the pattern 501 of the die 51 obtained in advance in step S103. That is, the controller CNT does not actually observe the pattern 601 of the wafer 6 and the pattern 501 of the die 51 in the alignment of step S104. The reference number 5D in FIG. 5 shows the relative position between the pattern 601 of the wafer 6 and the pattern 501 of the die 51 after the bonding process. Note that the relative position between the pattern 601 of the wafer 6 and the pattern 501 of the die 51 will be simply referred to as a "relative position" in some cases.

(Case 1) in FIG. 5 is an ideal state in which the relative position recognized by the controller CNT in the alignment and the relative position after the bonding process coincide with each other. In actual, however, the relative position recognized by the controller CNT in the alignment and the relative position after the bonding process may have an error, as represented in (Case 2) to (Case 4) of FIG. 5. According to Example 1, the relative position after the bonding process can be easily and accurately estimated by the estimation process in step S107. The estimation result of the relative position after the bonding process may be used to, for example, grasp (recognize) the bonding state between the wafer 6 and the die 51 or feed it back to the bonding process to be executed later.

In step S108, the controller CNT unloads, from the stage 43 (chuck 431) using a wafer conveyance mechanism (not shown), the wafer 6 to which the die 51 is bonded. The wafer 6 may be returned to the FOUP used for loading the wafer 6 or may be returned to a container other than the FOUR However, the thickness of the entire wafer 6 to which the die 51 is bonded changes and thus is preferably returned to another container. The operation sequence of the bonding apparatus 100 for bonding the die 51 to one wafer 6 has been explained above. When bonding the dies 51 to the respective wafers 6, the flowchart of FIG. 4 is repeated.

Since the number of dies 51 on the dicing frame 5 and the number of target regions on the wafer 6 are generally different, loading of the wafer 6 and loading of the dicing frame 5 do not synchronize in most cases. If the dies 51 on the dicing frame 5 run out during bonding of the dies 51 to one wafer 6, the next dicing frame 5 can be loaded into the bonding apparatus 100. If the dies 51 remain on the dicing frame 5 even after the end of bonding the dies 51 to one wafer 6, the remaining dies 51 can be used for the next wafer 6.

Figure 6:
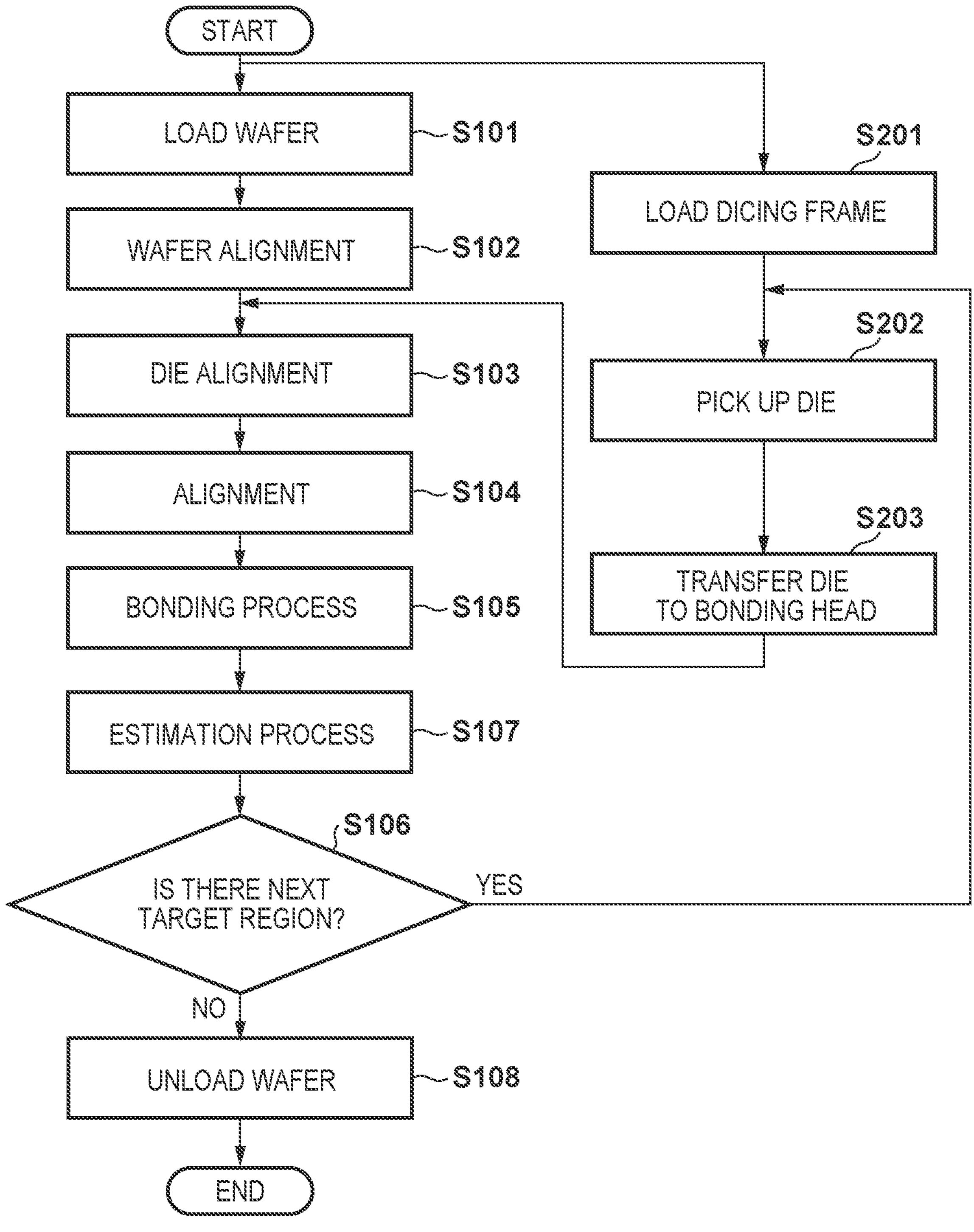
FIG. 6 is a flowchart showing the operation sequence of the bonding apparatus in Example 1 (modification)

In the flowchart of FIG. 4, the estimation process in step S107 is performed for the respective target regions on the wafer 6 (that is, the respective dies 51 bonded to the wafer 6) after determination in step S106. However, immediately after the bonding process in step S105, the estimation process in step S107 may be performed for the die 51 bonded to the wafer 6 in the bonding process, as shown in the flowchart of FIG. 6. This aims to reduce an idle waiting time when a waiting time is generated in the bonding unit 4, for example, when pickup of the die 51 in step S202 takes time. In this manner, the bonding process in step S105 and the estimation process in step S107 may be flexibly switched or interchanged depending on the timing of pickup of the die 51 in step S202. Some bonding methods take a proper time until the bonding state of the die 51 on the wafer 6 stabilizes after the bonding process in step S105. The proper time is, for example, the hardening time of an adhesive in adhesive bonding or the time from the start to end of covalent bonding on an activated bonding surface in room-temperature bonding using a surface activation method. If the estimation process in step S107 is executed before the bonding state stabilizes, an error may be generated between a final bonding state and the estimation result. To cope with this case, an arbitrary delay time is preferably set between the bonding process of step S105 and the estimation process of step S107 in FIG. 6. Note that steps S101 to S108 in FIG. 6 are processes similar to steps S101 to S108 in FIG. 4, and a detailed description thereof will be omitted.

Example 2

In Example 2, handling of an estimation result obtained in step S107 described in Example 1 will be explained. That is, an output example of the estimation result obtained in step S107*d* will be explained. Note that Example 2 basically inherits Example 1 described above and can comply with Example 1 except matters mentioned below.

The simplest handling of the estimation result is to display the estimation result in step S107 on the user interface (for example, a display) of a bonding apparatus 100 as information representing the bonding accuracy between the pattern of a wafer 6 and that of a die 51. The estimation result may be output as supplementary information of the wafer 6 unloaded in step S108. The estimation result may be displayed on the user interface as information representing the bonding accuracy of all or some dies 51 bonded on the wafer 6. In many semiconductor manufacturing sites, manufacturing apparatuses and processing apparatuses for executing other processes, in addition to the bonding apparatus 100, are connected by a network, and information is exchanged online between these apparatuses. Even the bonding apparatus 100 may announce online information representing the bonding accuracy of all or some dies bonded on a wafer, or output online at any time information representing the bonding accuracy in response to an information request received online. All pieces of information obtained in the processes of the flowcharts in FIGS. 4 and 6 described in Example 1 can also be output online.

As described above, after the bonding process between the wafer 6 (first member) and the die 51 (second member), the bonding apparatus 100 according to this embodiment controls a wafer observation camera 46 (first image capturing device) to capture an image of the outer appearance of the die 51 bonded to the wafer 6. The bonding apparatus 100 estimates the relative position between the pattern of the wafer 6 and that of the die 51 after the bonding process based on feature position information obtained from the image obtained by the wafer observation camera 46 and positional relationship information obtained in advance. Accordingly, the pattern of the wafer 6 and that of the die 51 after the bonding process can be obtained easily and accurately.

Second Embodiment

The second embodiment according to the present invention will be described. The second embodiment basically inherits the first embodiment and can comply with the first embodiment except matters mentioned below.

Figure 7:
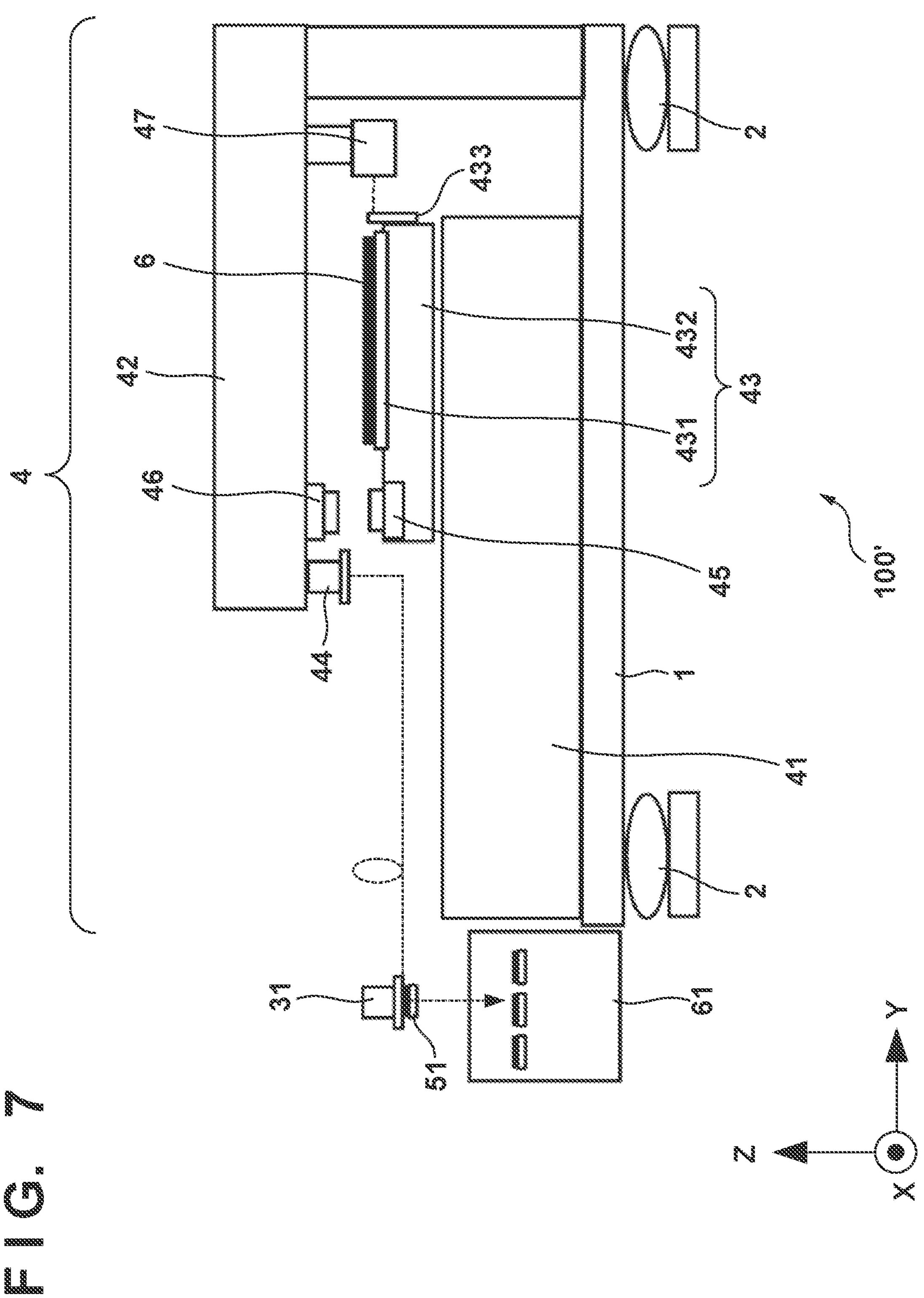
FIG. 7 is a schematic view showing a bonding apparatus according to the second embodiment.

FIG. 7 is a schematic view showing a bonding apparatus 100' according to the second embodiment. The bonding apparatus 100' according to this embodiment includes a die recovery unit 61 (die recovery container) that recovers a die 51 having a bonding failure in a bonding unit 4. The bonding apparatus 100' according to the second embodiment has a configuration similar to that of the bonding apparatus 100 according to the first embodiment except that the bonding apparatus 100' includes the die recovery unit 61, and a description of constituent elements other than the die recovery unit 61 will be omitted. In FIG. 7, a pickup unit 3 and a controller CNT are not illustrated.

The die recovery unit 61 has a structure that can receive the die 51 from a pickup head 31, and can be configured to hold (store) a plurality of dies 51 received from the pickup head 31. The die recovery unit 61 may be mounted on a base 1 on which the bonding unit 4 is mounted, or may be mounted on another base or a mechanism independent of other constituent elements. The die recovery unit 61 can be configured to be easily separated from the bonding apparatus 100'. For example, the die recovery unit 61 can be configured to be detached from the bonding apparatus 100' while storing the recovered die 51. Examples of this embodiment will be described below.

Example 3

Figure 8:
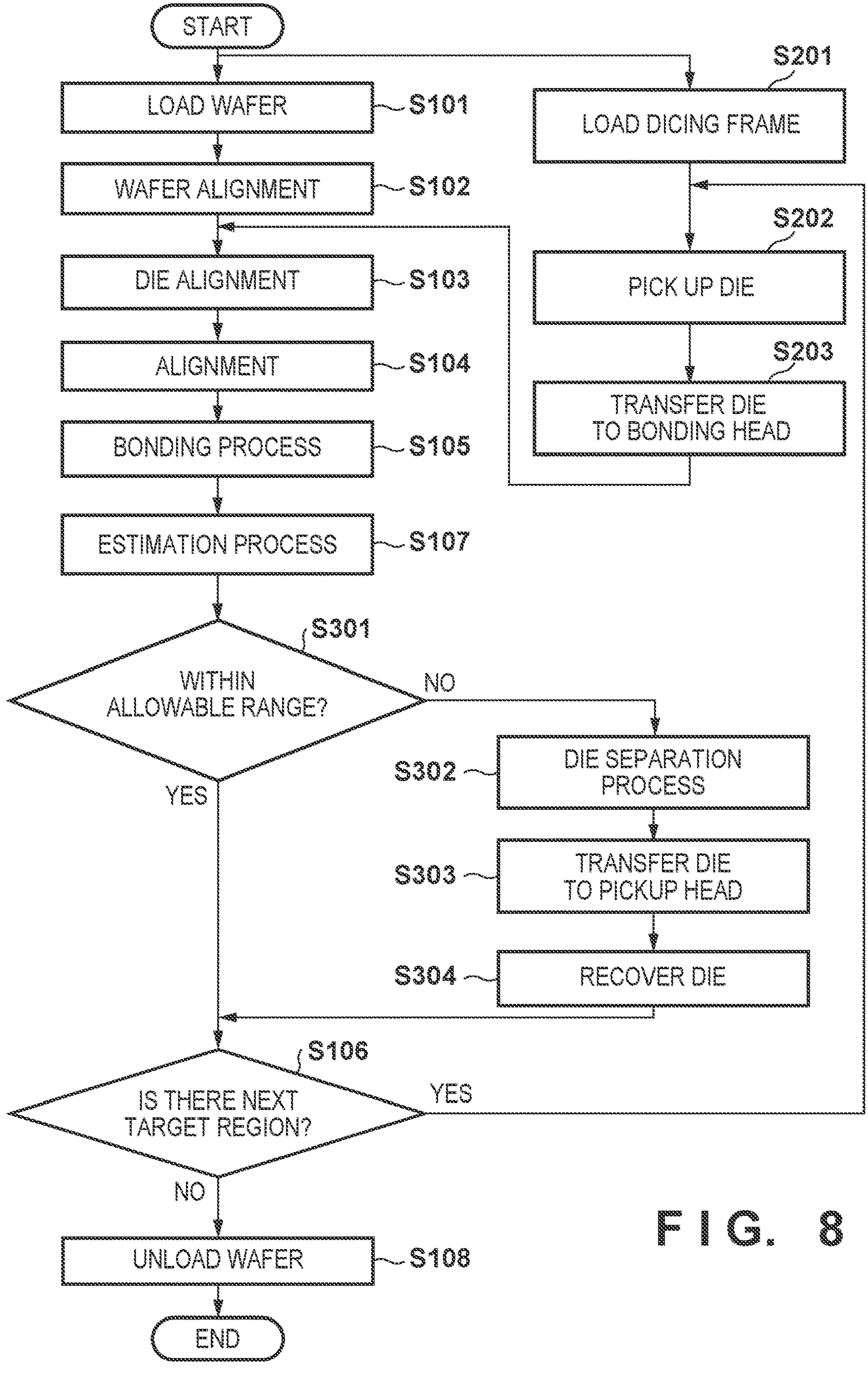
FIG. 8 is a flowchart showing the operation sequence of the bonding apparatus in Example 3.

FIG. 8 is a flowchart showing the operation sequence of a bonding apparatus 100' in Example 3. A controller CNT can execute processes in the flowchart of FIG. 8. Note that steps S101 to S108 and S201 to S203 in the flowchart of FIG. 8 are the same as those described in the first embodiment using the flowcharts of FIGS. 4 and 6, and a detailed description thereof will be omitted.

In step S301, the controller CNT determines, based on the estimation result of the estimation process in step S107, whether the deviation of the relative position between the pattern of a wafer 6 and a pattern 501 of a target die 51 after the bonding process falls within an allowable range. The allowable range can be set in advance based on the line widths, dimensions, and the like of the pattern of the wafer 6 and/or the pattern of the target die 51. The allowable range may be set based on the electrical characteristics of the bonded object of the wafer 6 and target die 51. If the deviation of the relative position falls within the allowable range, the process advances to step S106. If the deviation of the relative position does not fall within the allowable range, the process advances to step S302. Note that the die 51 for which the deviation of the relative position does not fall within the allowable range may be understood as the die 51 having a bonding failure. The die 51 for which the deviation of the relative position does not fall within the allowable range will be sometimes referred to as the "die 51 having a bonding failure".

In step S302, the controller CNT separates the die 51 having a bonding failure from the wafer 6 (separation process). More specifically, the controller CNT drives a stage 43 such that the die 51 having a bonding failure on the wafer 6 is arranged below a bonding head 44. Then, the controller CNT narrows the interval between the bonding head 44 and the wafer 6 (die 51 having a bonding failure), and when the die 51 having a bonding failure and the bonding head 44 come into contact with each other, controls the bonding head 44 to hold (pick up) the die 51. While the bonding head 44 holds the die 51 having a bonding failure, the controller CNT widens the interval between the bonding head 44 and the wafer 6. As a result, the die 51 having a bonding failure can be separated from the wafer 6.

This separation process pays attention to the fact that the die 51 can be separated from the wafer 6 before bonding between the wafer 6 and the die 51 is completed. That is, the separation process can be performed before bonding between the wafer 6 and the die 51 is completed. For example, in room-temperature bonding using a surface activation method, covalent bonding between molecules does not start until the interval between the wafer 6 and the die 51 becomes 0.1 nm order or less, the wafer 6 and the die 51 are maintained in a state short of the complete bonding state, and the die 51 can be separated from the wafer 6. Generally in room-temperature bonding using a surface activation method, the interval between the wafer 6 and the die 51 does not become 0.1 nm order or less unless the die 51 is pressed against the wafer 6. In room-temperature bonding using a surface activation method, therefore, before the die 51 is pressed against the wafer 6, the estimation process in step S107 is performed and the die 51 can be pressed against the wafer 6 in accordance with the estimation result. If the estimation result is satisfactory (that is, the deviation of the rotation amount falls within the allowable range), the die 51 is pressed against the wafer 6. If the estimation result is unsatisfactory (that is, the deviation of the rotation amount falls outside the allowable range), the separation process is performed. In adhesive bonding, before an adhesive hardens, the wafer 6 and the die 51 are in a state before the complete bonding state, and the die 51 can be separated from the wafer 6. The separation process in step S302 is executed in accordance with a bonding method at a timing when the bonding state can be canceled.

In step S303, the controller CNT delivers (transfers) the die 51 held by the bonding head 44 to a pickup head 31. More specifically, the controller CNT arranges the pickup head 31 below the bonding head 44 by driving the pickup head 31 in the X direction. The controller CNT then delivers the die 51 from the bonding head 44 to the pickup head 31 by driving the pickup head 31 in the +Z direction.

In step S304, the controller CNT moves the pickup head 31 to the die recovery unit 61, and delivers the die 51 held by the pickup head 31 to the die recovery unit 61. Accordingly, the separation/recovery of the die 51 having a bonding failure is completed. After the end of step S304, the process advances to step S106. Note that the bonding process of the new die 51 may be executed again for the target region of the wafer 6 from which the temporarily bonded die 51 has been separated.

Example 4

Figure 9:
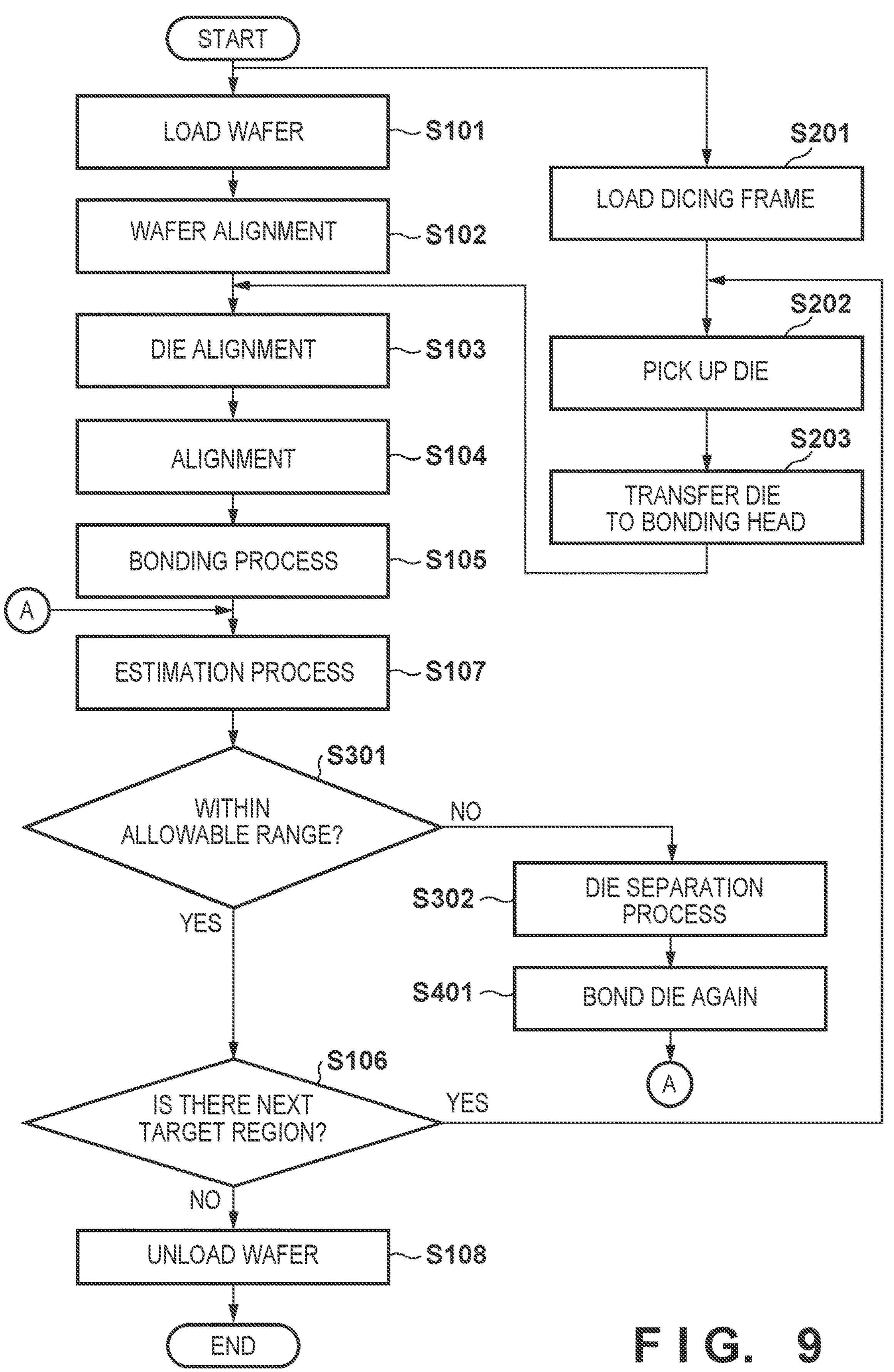
FIG. 9 is a flowchart showing the operation sequence of the bonding apparatus in Example 4.

FIG. 9 is a flowchart showing the operation sequence of a bonding apparatus 100' in Example 4. A controller CNT can execute processes in the flowchart of FIG. 9. Note that steps S101 to S108 and S201 to S203 in the flowchart of FIG. 9 are the same as those described in the first embodiment using the flowcharts of FIGS. 4 and 6, and a detailed description thereof will be omitted.

In step S301, the controller CNT determines, based on the estimation result of the estimation process in step S107, whether the deviation of the relative position between the pattern of a wafer 6 and a pattern 501 of a target die 51 after the bonding process falls within an allowable range. In step S302, the controller CNT separates the die 51 having a bonding failure from the wafer 6 (the separation process). Steps S301 and S302 are the same as those described in Example 3, and a detailed description thereof will be omitted.

In step S401, the controller CNT bonds again onto the wafer 6 the die 51 separated from the wafer 6 in step S302. More specifically, the controller CNT aligns again the wafer 6 and the die 51 so as to correct the deviation amount of the relative position based on the deviation amount of the relative position estimated in step S107. Then, the controller CNT bonds again the die 51 to the wafer 6 by narrowing the interval between the wafer 6 and the die 51. By this process, the die 51 can be bonded again to the wafer 6 so as to correct the deviation of the relative position between the pattern of the wafer 6 and that of the die 51 that is generated in the first bonding. After the die 51 is bonded again to the wafer 6, the process advances to step S107.

As described above, according to this embodiment, it is determined based on the estimation result of the estimation process in step S107 whether the deviation of the relative position between the pattern of the wafer 6 and that of the die 51 after the bonding process falls within the allowable range. If the deviation of the relative position does not fall within the allowable range, the die 51 is separated from the wafer 6. Hence, the new die 51 can be bonded to the target region of the wafer 6 from which the die 51 has been separated, or the separated die 51 can be bonded again.

<Embodiment of Article Manufacturing Method>

A method of manufacturing an article (a semiconductor IC element, a liquid crystal element, a MEMS, or the like) using the above-described bonding apparatus will be described. The article manufacturing method according to the embodiment of the present invention is suitable for, for example, manufacturing an article such as a microdevice (for example, a semiconductor device) or an element having a microstructure. The article manufacturing method according to the embodiment includes a step of bonding a second member to a first member using the above-described bonding apparatus, a step of processing the first member to which the second member is bonded, and a step of manufacturing an article from the processed first member. In the above-described bonding apparatus, the bonding state between the first and second members can be easily and accurately grasped by estimating the relative position between the pattern of the first member and that of the second member after the bonding process. Also, a die can be bonded again in the bonding apparatus based on the estimation result of the relative position. Information of the estimation result of the relative position can also be reflected in a subsequent step. The subsequent step is another known step including probing, dicing, bonding, packaging, and the like. The article manufacturing method according to the embodiment is superior to a conventional method in at least one of the performance, quality, productivity, and production cost of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-120714 filed on Jul. 28, 2022, which is hereby incorporated by reference herein in its entirety.

What is claimed is:

1. A bonding apparatus for bonding a second member including a second pattern to a first member including a first pattern, comprising:

a first image capturing device; and a controller configured to control a bonding process of bonding the second member to the first member, wherein the controller is configured to determine a relative position between the first pattern and the second pattern after the bonding process, based on feature position information and positional relationship information, wherein the first pattern is different from a first alignment mark formed on the first member and the second pattern is different from a second alignment mark formed on the second member, the first alignment mark and the second alignment mark being used to align the first member and the second member before the bonding process, wherein the feature position information represents a position of a feature portion of the second member with respect to the first member, and is obtained based on an image of the second member bonded to the first member by the bonding process, the image being captured by the first image capturing device, and wherein the positional relationship information represents a positional relationship between the feature portion and the second pattern.

2. The apparatus according to claim 1, further comprising a second image capturing device configured to capture an image of the second alignment mark provided on the second member, wherein the first image capturing device is configured to capture an image of the first alignment mark provided on the first member, and wherein the controller is configured to:

obtain information regarding a relative position between the first member and the second member based on a position of the first alignment mark in the image captured by the first image capturing device and a position of the second alignment mark in the image captured by the second image capturing device; and control a process of aligning the first member and the second member based on the obtained information regarding the relative position between the first member and the second member, and bonding the second member to the first member.

3. The apparatus according to claim 2, wherein the information regarding the relative position between the first member and the second member includes information regarding a relative position between the first pattern and the second pattern.

4. The apparatus according to claim 2, further comprising:

a first holder configured to hold the first member; and a second holder configured to hold the second member, wherein the controller is configured to control the bonding process by relatively driving the first holder and the second holder.

5. The apparatus according to claim 4, wherein the first image capturing device is arranged to capture an image of a first bonding surface which is a bonding surface of the first member, in a state in which the first member is held by the first holder, and the second image capturing device is arranged to capture an image of a second bonding surface which is a bonding surface of the second member, in a state in which the second member is held by the second holder.

6. The apparatus according to claim 1, wherein the feature portion of the second member is an index that can be confirmed in both an image obtained by capturing a second bonding surface which is a bonding surface of the second member and an image obtained by capturing a surface opposite to the second bonding surface.

7. The apparatus according to claim 1, wherein the feature portion of the second member is an outer edge of the second member.

8. The apparatus according to claim 1, wherein the feature portion of the second member is a through hole extending from a second bonding surface which is a bonding surface of the second member to a surface opposite to the second bonding surface.

9. The apparatus according to claim 2, wherein the controller is configured to obtain the feature position information based on images obtained by the second image capturing device before the bonding process.

10. The apparatus according to claim 1, wherein the controller is configured to determine the relative position between the first pattern and second pattern by converting the position of the feature portion of the second member in the feature position information into a position of the second pattern based on the positional relationship information.

11. The apparatus according to claim 1, wherein the controller is configured to output information representing the relative position between the first pattern and second pattern obtained based on the positional relationship information and the feature position information.

12. The apparatus according to claim 1, wherein the controller is configured to output an evaluation result of the relative position between the first pattern and second pattern obtained based on the positional relationship information and the feature position information.

13. The apparatus according to claim 1, wherein the controller is configured to execute a separation process of separating the second member from the first member, in accordance with an evaluation result of the relative position between the first pattern and second pattern obtained based on the positional relationship information and the feature position information.

14. The apparatus according to claim 1, further comprising a second image capturing device, wherein the positional relationship information is obtained based on an image of a second bonding surface including the second pattern before the bonding process, the image being captured by the second image capturing device.

15. A bonding method of bonding a second member including a second pattern to a first member including a first pattern, comprising:

bonding the second member to the first member;

determining, after the bonding process, a relative position between the first pattern and the second pattern based on feature position information and positional relationship information, wherein the first pattern is different from a first alignment mark formed on the first member and the second pattern is different from a second alignment mark formed on the second member, the first alignment mark and the second alignment mark being used to align the first member and the second member before the bonding process, wherein the feature position information represents a position of a feature portion of the second member with respect to the first member, and is obtained based on an image of the second member bonded to the first member, and wherein the positional relationship information represents a positional relationship between the feature portion and the second pattern.

16. A method of manufacturing an article, comprising:

bonding a second member to a first member using a bonding method defined in claim 15;

processing the first member to which the second member has been bonded; and manufacturing an article from the processed first member.

* * * * *